United States Patent

Dunn et al.

Patent Number: 5,555,089
Date of Patent: Sep. 10, 1996

[54] ABSOLUTE DISTANCE MEASURING INTERFEROMETRY USING MULTI-PASS RESONANT CAVITY REFERENCED TO A STABILIZED LASER SOURCE

[75] Inventors: Thomas J. Dunn, Mohegan Lake, N.Y.; Dharmesh G. Panchal, Greenwich, Conn.

[73] Assignee: Anvik Corporation, Hawthorne, N.Y.

[21] Appl. No.: 347,774

[22] Filed: Nov. 30, 1994

[51] Int. Cl.$^6$ .................................................. G01B 9/02
[52] U.S. Cl. .......................................... 356/352; 356/357
[58] Field of Search ...................................... 356/352, 357, 356/358

[56] References Cited

U.S. PATENT DOCUMENTS 5,412,474  5/1995  Reasenberg et al. ................... 356/352

OTHER PUBLICATIONS

"Measurements of Ultrasmall Displacements", Jacobs, SPIE vol. 126, Aug.–1977, pp. 39–43.

Primary Examiner—Samuel A. Turner
Attorney, Agent, or Firm—Carl C. Kling

[57] ABSTRACT

The absolute distance measuring interferometer (ADMI) is a multi-pass interferometer which is a resonant cavity consisting of two plane parallel mirrors whose length is referenced to a stabilized laser system. The resonant cavity can be used in order to measure very precisely (to within a fraction of a wavelength) the distance between a reference plane and an object. Due to its multi-pass nature, the length of the cavity can be measured much more accurately than for a conventional interferometer. The optical transmission bandwidth of the resonant cavity is inversely proportional to its length. A direct measure of the transmission bandwidth provides an extremely precise (to within a fraction of a wavelength) absolute measure of the length of the cavity. This eliminates the need for careful alignment during the motion of one of the mirrors of the multi-pass interferometer. In fact one can completely decouple the mirrors of the resonant interferometer and reassemble the resonant cavity at a different separation and measure the change in distance. This is extremely useful in situations where it is not possible to change distances while maintaining alignment of the cavity.

3 Claims, 2 Drawing Sheets

ABSOLUTE DISTANCE MEASURING INTERFEROMETRY USING MULTI-PASS RESONANT CAVITY REFERENCED TO A STABILIZED LASER SOURCE

BACKGROUND OF THE INVENTION

1. Field of the Invention

This invention relates to precision measurements of large and small displacements and particularly relates to an absolute distance measuring interferometer (ADMI) which measures the absolute distance between the two mirrors of a multi-pass resonant cavity that is referenced to a frequency-stabilized laser source.

2. Description of Related Art

The capability of measuring large and small distances with high precision is useful in a broad range of applications including those within the field of metrology, high-resolution X-ray lithography, and optical lithography. Conventional high-resolution distance measuring interferometers measure only relative changes in distance. This measurement is accomplished by comparing the distance to be measured with some calibrated distance such as the wavelength of a known frequency of light. Conventional interferometers carry out this measurement by actually counting the number of wavelengths while the change in distance is being made; consequently, they can only measure relative changes in distance.

A conventional high-resolution interferometer consists of a laser source which generates a coherent source of monochromatic radiation of wavelength $\lambda$. The output of the laser is split by a beamsplitter to enter the two arms of an interferometer. One of the arms is the reference arm while the other is the measuring arm of the interferometer. Both arms have a high reflectivity mirror to retro-reflect the light directly back to the beamsplitter. When the light reflects off the mirrors in both arms and is re-combined at the beamsplitter, the combined light is directed toward a detector. The light incident on the detector can undergo constructive or destructive interference due to the coherent properties of the laser radiation. Whether or not the emerging beam undergoes constructive or destructive interference depends on the relative difference in length of the two arms of the interferometer. If the measuring arm changes in length by one wavelength, then the emerging beam will undergo a single cycle of changing from constructive to destructive interference and back again.

One can measure changes in the length of the measuring arm of the interferometer by counting the number of cycles of constructive/destructive interference and hence the number of wavelengths of light while the measuring mirror moves through that range. This interferometer must remain carefully aligned during the motion to ensure that an accurate counting of the wavelengths is achieved. If the alignment is disrupted during the measurement, then all the relevant information is lost.

There are existing systems which interferometrically measure absolute distances, but they suffer from problems of complexity, size, or lack of dynamic range. For example, U.S. Pat. No. 5,412,474 to Reasenberg et. al. describes a system in which the distance is measured through a determination of the Free Spectral Range (FSR). This system requires two probe frequencies and multiple feedback systems in order to lock the laser source to two successive maxima and/or minima (nodes) in the transmission through an optical cavity. This system also requires that the cavity to be measured must have a length that is a half-integer multiple of the laser wavelength. This requires that the laser wavelength be shifted to match the cavity or that the cavity length be altered to match the laser.

SUMMARY OF THE INVENTION

The absolute distance measuring interferometer (ADMI) is a multi-pass interferometer which is a resonant cavity consisting of two plane parallel mirrors whose length is referenced to a stabilized laser system. Due to its multi-pass nature, the length of the cavity can be measured much more accurately than for a conventional interferometer. The optical transmission bandwidth (also called the Free Spectral Range) of the resonant cavity is inversely proportional to its length. A direct measure of the transmission bandwidth provides an absolute measure of the length of the cavity. This eliminates the need for careful alignment during the motion of one of the mirrors of the multi-pass interferometer. In fact one can completely decouple the mirrors of the resonant interferometer and reassemble the resonant cavity at a different separation and measure the change in distance. This is extremely useful in situations where it is not possible to change distances while maintaining alignment of the cavity.

Unlike most standard interferometers, which can only measure relative changes in distance by a comparison between the moving portion of the interferometer with the reference portion, this invention directly measures the absolute separation between two mirrors of a resonant cavity. This measurement does not require that alignment be maintained while the distance between the mirrors is changed as is the case for conventional interferometers.

The object of the invention is to provide an absolute distance measurement method and system for very small distances, using a multi-pass resonant cavity referenced to a frequency-stabilized laser source.

A feature of the invention is its use of a multi-pass resonant cavity in which the optical transmission bandwidth is inversely proportional to its length.

An advantage of the invention is that it provides a distance measurement system which does not require alignment while the separation of the mirrors of the resonant cavity are changing. Other objects, features and advantages of the invention will be described in the following written description and in the following drawings.

FIG. 3a–d show how the absolute measurement of the length of the cavity is implemented.

PREFERRED EMBODIMENT OF THE INVENTION

Environment of the Invention

Figure 1:
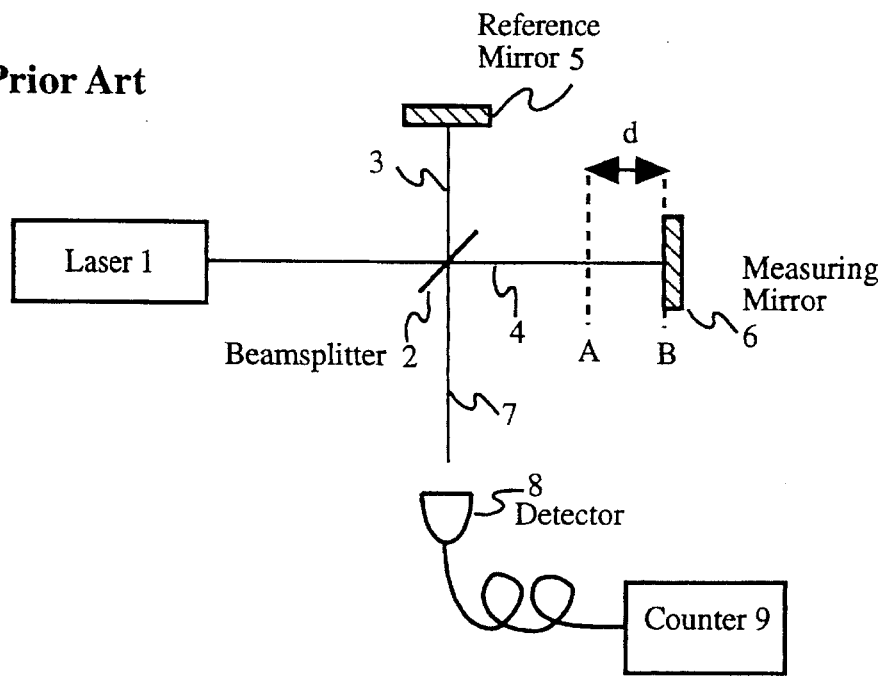
FIG. 1 is a schematic representation of a prior art high-resolution distance measuring interferometer, which requires alignment while the change in distance is being made and which measures only relative changes in distance.

FIG. 1 is a schematic representation of a prior art conventional high-resolution distance measuring interferometer. The laser system 1 is a coherent source of monochromatic radiation of wavelength $\lambda$. The optical output of the laser 1 is split into two beams by the beamsplitter 2. One of the beams forms the reference arm 3 and reflects from the reference mirror 5. The other beam forms the measurement arm 4 and reflects from the measuring mirror 6. Both of the reflected beams are again incident upon the beamsplitter 2 and combine to form the detected beam 7 which is recorded by detector 8. When the light from the measurement arm 4 and the reference arm 3 recombines to form the detected arm 7, the combined beam 7 can undergo constructive or destructive interference depending upon the relative difference in the optical path length of the two arms of the interferometer. When the relative path difference between the arms of the interferometer changes by one wavelength, the detected beam 7 will undergo one cycle of changing from constructive to destructive interference and back again. This cycling change of intensity is detected by the detector 8 and counted by the computer 9. One can measure large relative changes of distance d in the measuring arm of the interferometer (from point A to point B) by counting the number of cycles of constructive/destructive interference and hence the number of wavelengths of light that the mirror has moved. In order for this measurement scheme to work, the moving measuring mirror 6 must remain aligned during the motion in order to count the number of wavelengths of light. If the mirror becomes misaligned, then all information about the relative change in distance is lost.

Description of the Invention

Figure 2:
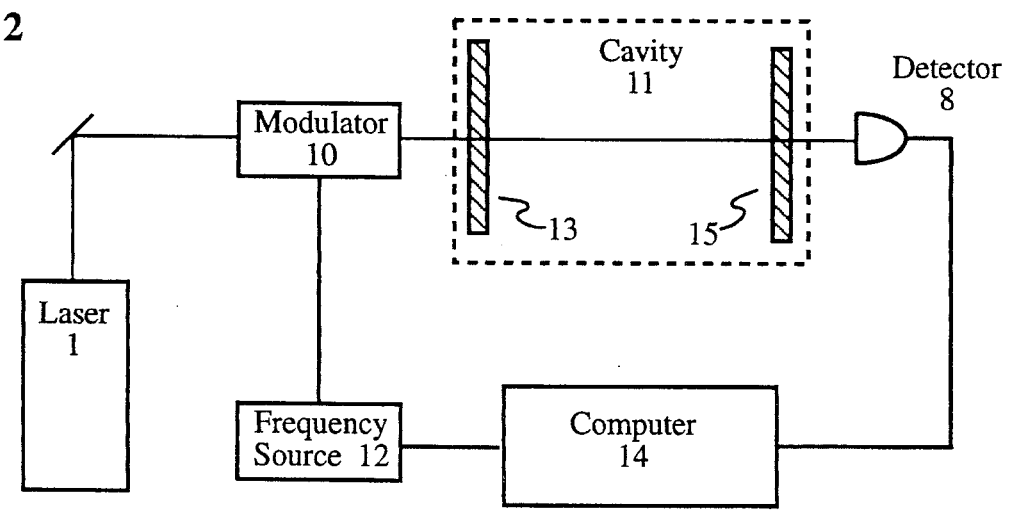
FIG. 2 is a schematic representation of the absolute distance measuring interferometer of this invention.

FIG. 2 is a schematic representation of this invention, the absolute distance measuring interferometer (ADMI). The output of a stabilized laser system 1 is passed through a modulator 10. The modulator 10 will modulate the intensity of the laser light and add sidebands to the spectrum of the laser radiation. The frequency of the modulation $w_m$ is fed into the modulator from a frequency source 12 that is controlled by a computer 14. If the output of the laser is at frequency w, then the modulator will add sidebands or spectral frequency components at frequencies $w+w_m$ and $w-w_m$. This modulated laser beam is incident on the first mirror 13 of a resonant cavity 11 which will transmit a fraction of the radiation into the cavity 11. Once the radiation is in the cavity 11, it will reflect many times between the two plane parallel mirrors, 13 and 15. The optical radiation in the cavity will pass through the second mirror 15 only if the radiation is coincident with one of the resonant modes of the laser cavity which is described below. Any radiation that is transmitted by the resonant cavity 11 is recorded by the detector 8 and is fed into the computer 14.

The two highly reflecting plane parallel mirrors 13 and 15 act as an optical filter passing only those optical frequencies which obey the relationship $$v_n = \frac{nc}{2L} \qquad \text{Eq. 1}$$

where n is an integer number, L is the length of the cavity, and c is the speed of light. The difference between two adjacent frequencies which will pass through the cavity is given by the expression $$\Delta v = v_n - v_{n-1} = \frac{c}{2L} \qquad \text{Eq. 2}$$

where $\Delta v$ is called the Free Spectral Range (FSR) of the resonant cavity.

By measuring exactly the Free Spectral Range of the resonant cavity it is possible to determine with high precision the length of the cavity. This invention describes a system and a method to accurately measure the absolute separation between the two mirrors of the resonant cavity. This invention does not require any measurement to be made while the distance between the mirrors is changed. Consequently there is no need to maintain the alignment of the cavity while the distance between the mirrors is changed. This represents a significant relaxation on the mechanical tolerances of the interferometer.

This Absolute Distance Measuring Interferometer (ADMI) can also be used in applications where conventional interferometers would fail. For many applications it is not possible to continuously vary the distance to be measured so that the number of wavelengths involved in the change can be detected and counted. There are some applications such as in X-ray lithography where the changes in distance to be measured occur in discrete steps which are many orders of magnitude larger than the wavelength of light. For these applications ADMI is highly attractive for accurately measuring the change in distance with the required resolution.

FIG. 2 shows the preferred embodiment of the invention. A frequency-stabilized laser 1 provides an absolute wavelength calibration standard for the optical cavity 11 shown in the figure. If the cavity 11 is of an unknown length then the stabilized frequency from the laser will fall arbitrarily between two adjacent transmission peaks of the resonant cavity. In the operation outlined below, the computer 14 will change the modulation frequency from the frequency source 12 to the modulator 10 in conjunction with recording the intensity of the detector 8. By evaluating the variation of intensity with applied modulation frequency, the Free Spectral Range of the resonant cavity 11 can be determined very accurately.

Operation of ADMI

Figure 3A:
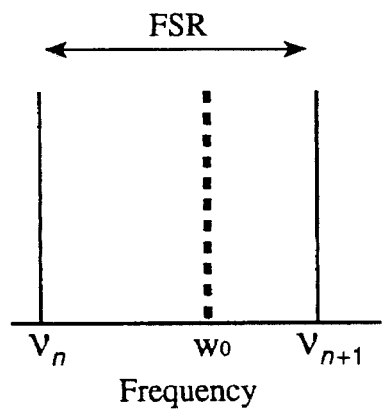
Figure 3B:
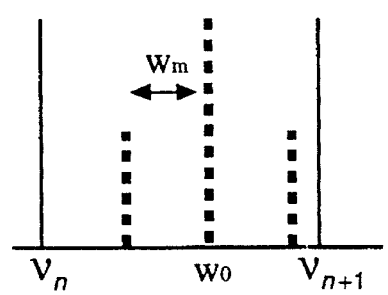
Figure 3C:
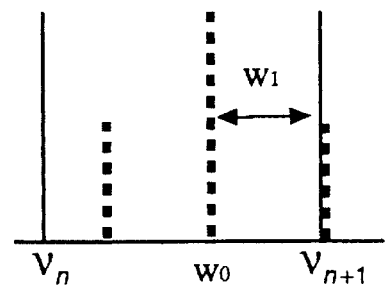
Figure 3D:
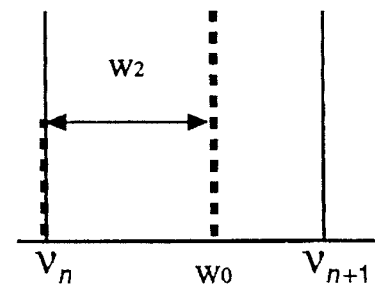

The two transmission peaks on either side of the stabilized frequency as shown in FIG. 3a represent two consecutive orders which obey the relationship given in Eq. 1. In order to measure the FSR the stabilized laser system 1 is modulated by a modulator 10 whose frequency is determined by a frequency source 12 controlled and monitored by a computer 14. The modulator 10 generates sidebands on the stabilized frequency $w_0$ which are shown in FIG. 3b as $w_0+w_m$ and $w_0-w_m$ where $w_m$ is the modulation frequency. As $w_m$ is increased from zero to some value $w_1$ as shown in FIG. 3c the resonant cavity 11 will transmit the sideband $w_0+w_1$ since it obeys Eq. 1 and will be detected by the detector 8. The computer then records the value of $w_1$. As the modulation frequency $w_m$ is further increased to the value of $w_2$ as shown in FIG. 3d the resonant cavity 11 will transmit the sideband $w_0-w_2$ since it also obeys Eq. 1 for a different order. This transmitted peak will be noted by the detector 8 so that the computer 14 records the value $w_2$. In summary, the computer 14 simply scans through a range of frequencies which is fed into the modulator 10 and searches for the two frequencies which correspond to maximum transmission through the resonant cavity 11 as recorded by detector 8. The FSR is simply the sum of the recorded values, $w_1+w_2$, and then the length can be accurately calculated from the FSR using Eq. 2.

The calculation performed above allows one to determine the separation of the two mirrors to within one half the calibrated wavelength standard. Additional higher precision can be obtained by calculating the ratio R where, $$R = \frac{w_2}{FSR} \qquad \text{Eq. 3}$$

This ratio, R, times the quantity $\lambda/2$, is added to the length of the cavity calculated directly from the Free Spectral Range. This determines the location of the fundamental wavelength within the Free Spectral Range and provides an additional two orders of magnitude in precision.

There are other methods to measure the FSR of a cavity with an unknown length. The technique just described keeps the cavity length fixed and varies the modulation frequency to find the transmission peaks. An alternative method is to fix the modulation frequency and vary the cavity length by a very small amount to determine the transmission peaks. With a known modulation frequency one simply records the distance required to move the mirror from a length which allows either sideband to transmit through the cavity to a length which allows the fundamental to transmit through the cavity. This can be done by adding a PZT onto the resonant cavity in FIG. 2. By accurately recording the distance dL moved to transmit either sideband to transmitting the fundamental, one solves the equation:

$$L = \frac{\partial L}{\partial v} v \qquad \text{Eq. 3}$$

where $\delta v$ is the modulation frequency and $v$ is the known frequency source.

What is claimed is:

1. An absolute distance measuring interferometer using two mirrors in a multi-pass resonant cavity, comprising:
   a) an independently stabilized laser system for providing a frequency standard (of frequency $w_0$) known to very high precision where frequency $W_0$ is independent of the transmission peaks of said multi-pass resonant cavity;
   b) a modulator which modulates at frequency $w_m$, the output of said stabilized laser system generating optical spectral components $w_0+w_m$ and $w_0-w_m$ whose frequency of modulation $w_m$ is determined by an external frequency source;
   c) a multi-pass interferometer having two mirrors forming said resonant cavity and whose optical transmission bandwidth (also known as Free Spectral Range) is inversely proportional to its length;
   d) a detection system which monitors the optical intensity from said resonant cavity; and
   e) computer means, connected to receive inputs from said detection system and from said frequency source, programmed to calculate the absolute distance between the mirrors of said resonant cavity based on inputs from said detection system and said frequency stabilized laser source.

2. The method of operating a multi-pass interferometer as an absolute distance measuring device, the interferometer being of the multi-pass type having a stabilized laser input, having two mirrors forming a resonant cavity, having the characteristic that the optical transmission bandwidth of the resonant cavity (also known as Free Spectral Range) is inversely proportional to its length and where said method comprises the following steps:
   a) keeping the cavity length fixed;
   b) varying the modulation frequency to find successive transmission peaks, $v_n$ and $v_{n-1}$, of the multi-pass resonant cavity;
   calculating the Free Spectral Range from the sum of the modulation frequencies which corresponds to the successive transmission peaks $v_n$ and $v_{n-1}$; and
   calculating the cavity length distance between the mirrors of said resonant cavity from the information about the Free Spectral Range calculated in step c).

3. The method of claim 2, in which a fraction of the optical bandwidth is calculated as the ratio of one of the frequency sidebands to the Free Spectral Range, yielding a more precise value of the absolute distance separating the two mirrors.

* * * * *